United States Patent [19]

Stormont et al.

[11] Patent Number: 4,721,688
[45] Date of Patent: Jan. 26, 1988

[54] METHOD OF GROWING CRYSTALS

[75] Inventors: Richard W. Stormont, Warwick, R.I.; Chang C. Chao, Lexington, Mass.

[73] Assignee: Mobil Solar Energy Corporation, Billerica, Mass.

[21] Appl. No.: 908,588

[22] Filed: Sep. 18, 1986

[51] Int. Cl.⁴ .................. H01L 31/00; C30B 15/34
[52] U.S. Cl. .................................. 437/115; 156/608;
156/617 M; 156/DIG. 83; 156/DIG. 88;
422/246; 422/249
[58] Field of Search ............. 156/608, 617 M, 617 H,
156/621, 624, DIG. 64, DIG. 88, DIG. 83, 617
V; 118/412, 415, 405; 422/245, 246, 254, 249;
29/572, 573

[56] References Cited

U.S. PATENT DOCUMENTS

| 3,241,925 | 3/1966 | Cakenberghe | 156/608 |
| 3,591,348 | 7/1971 | Labelle, Jr. | 156/DIG. 88 |
| 3,687,633 | 8/1972 | Labelle, Jr. et al. | 156/DIG. 88 |
| 3,953,174 | 4/1976 | Labelle, Jr. | 156/608 |
| 4,000,030 | 11/1976 | Ciszek | 156/608 |
| 4,193,974 | 3/1980 | Kotval et al. | 156/608 |
| 4,217,165 | 8/1980 | Ciszek | 156/624 |
| 4,221,754 | 9/1980 | Nowak | 156/608 |
| 4,225,378 | 9/1980 | Garrison | 422/246 |
| 4,289,571 | 9/1981 | Jewett | 156/617 H |
| 4,299,648 | 11/1981 | Ciszek et al. | 156/608 |
| 4,321,283 | 3/1982 | Patel et al. | 29/572 |
| 4,390,505 | 6/1983 | Taylor et al. | 156/DIG. 73 |
| 4,468,281 | 8/1984 | Bender et al. | 156/624 |
| 4,469,552 | 9/1984 | Thornhill | 156/608 |

FOREIGN PATENT DOCUMENTS 1029804  5/1966  United Kingdom ........... 156/617 M

Primary Examiner—John Doll
Assistant Examiner—R. Bruce Breneman
Attorney, Agent, or Firm—Schiller, Pandiscio & Kusmer

[57] ABSTRACT

The invention comprises an improved method of growing crystalline bodies from a melt. The method involves providing (1) a crucible for containing a melt having a plurality of first and second grooves of capillary size formed in first and second opposite side walls thereof respectively, and enlargements at the upper ends of the slots for facilitating crystal growth, (2) a feed cavity associated with the crucible for receiving solid source material for replenishing the melt, and (3) a passageway between the feed cavity and the crucible for transmitting melted source material to the crucible so as to replenish the melt in the crucible. A plurality of ribbons are formed by positioning a seed between each pair of first and second grooves, contacting the seeds with the melt, and then withdrawing the seeds vertically out of the crucible.

10 Claims, 7 Drawing Figures

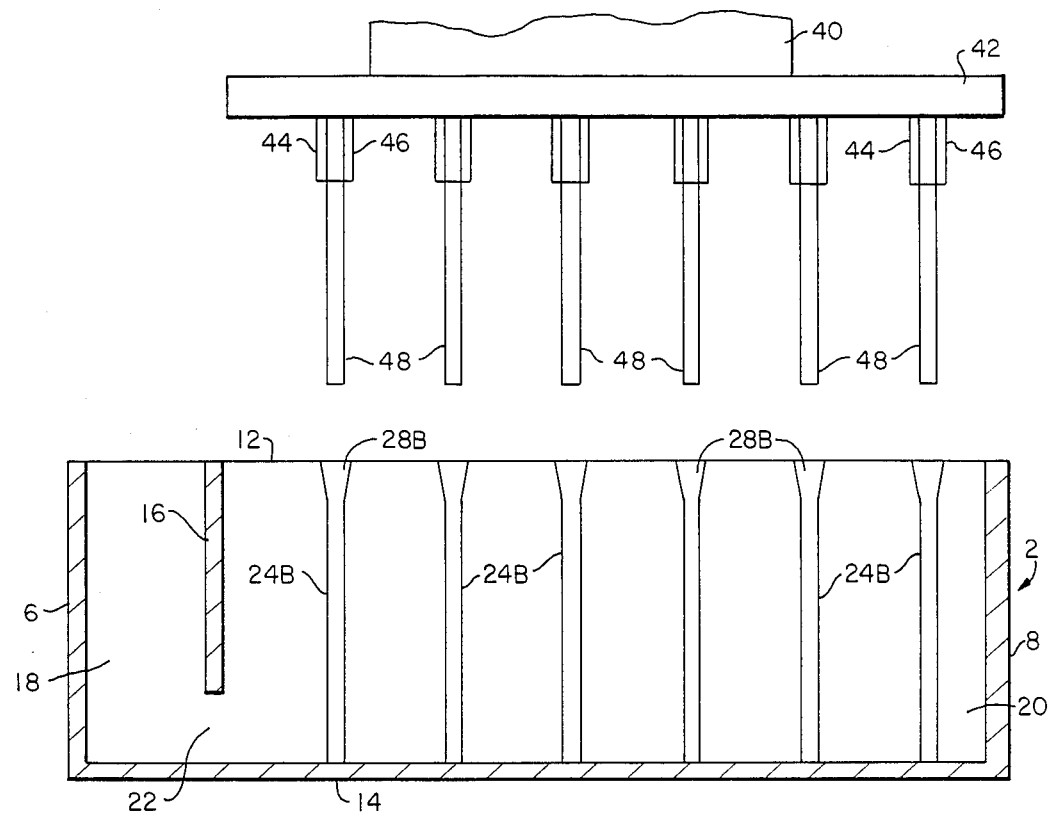
FIG. 2
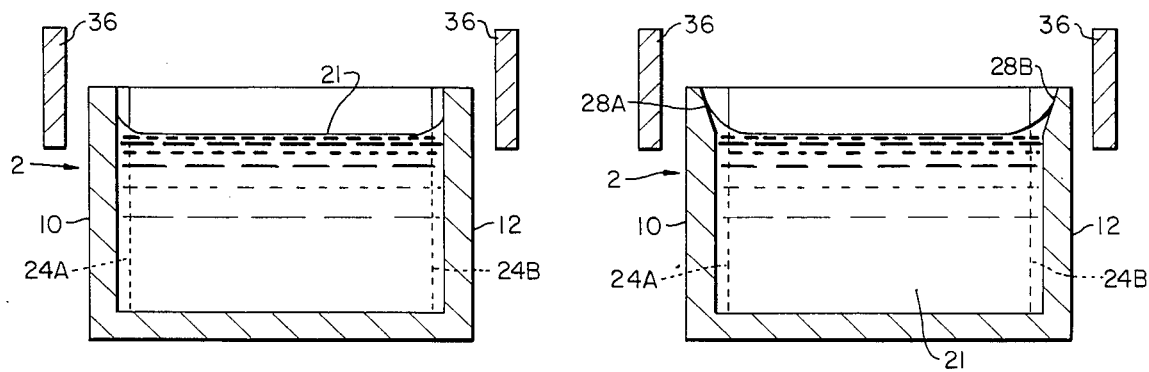
FIG. 3
FIG. 4

METHOD OF GROWING CRYSTALS

This invention relates generally to growth of crystals from a melt and more particularly to the drawing of elongate crystalline bodies from a melt of a material such as silicon, germanium, sapphire or the like.

Growth of crystalline bodies in the form of ribbons or other shapes has been accomplished by several well-known methods, including by means of a capillary die according to the "Edge-Defined, Film-Fed Growth" technique (commonly known as "EFG") which is exemplified and described in varying detail in U.S. Pat. Nos. 3,591,348, 3,687,633, 3,953,174 and 4,390,505. Other related methods of growing crystalline bodies are disclosed by A. V. Stepanov et al, "Growing of Crystalline Germanium Plate," Soviet Physics-Solid State, Vol. 8, No. 2, February 1966, pp. 449–450, British Patent Application No. 2067920A of E. Sachs, published Aug. 5, 1981, and U.S. Pat. Nos. 4,469,552, issued to J. W. Thornhill, 4,468,281, issued to D. L. Bender, 4,221,754, issued to W. B. Nowak, 4,299,648, issued to T. F. Ciszek et al, and 4,000,030, issued to T. F. Ciszek.

OBJECTS AND SUMMARY OF THE INVENTION

A primary object of the invention is to provide a method of growing a ribbon by the use of surface tension-controlled edge-stabilized growth.

A further object of the invention is to provide a method for pulling multiple ribbons from a melt in a single crucible by the use of surface tension-controlled edge-stabilized growth.

A further object of the invention is to provide a method for growing crystalline bodies from a melt wherein the total impurities present in the grown bodies are less than the total impurities in crystalline products grown according to the EFG technique.

Another object of the invention is to provide a method for pulling one or more multiple ribbons from a crucible adapted to facilitate replenishment of the source material, so as to maintain a constant melt level in the crucible from which to grow the ribbons.

Still another object is to provide a new and improved crucible apparatus for use in enabling surface tension-controlled edge-stabilized growth of ribbons.

A more specific object is to provide a crucible having means for enabling edge-stabilized growth of one or more ribbon-like crystalline bodies from a melt of a selected source material.

In the preferred mode of practicing the invention, these and other objects are achieved by providing (1) a crucible for containing a melt having a plurality of first and second grooves of capillary size formed in first and second opposite side walls thereof respectively, and enlargements at the upper ends of the slots for facilitating crystal growth, (2) a feed cavity associated with the crucible for receiving solid source material for replenishing the melt, and (3) a passageway between the feed cavity and the crucible for transmitting melted source material to the crucible so as to replenish the melt in the crucible. A plurality of ribbons are formed by positioning a seed between each pair of first and second grooves, contacting the seeds with the melt, and then withdrawing the seeds vertically out of the crucible.

Other objects, features and advantages of the invention are set forth in the following detailed description of a preferred embodiment of the invention and the accompanying drawings wherein:

FIG. 2 is a longitudinal sectional view of the apparatus of FIG. 1 taken along line 2—2 of FIG. 1;

FIG. 3 is a cross-sectional schematic representation showing the meniscus formed by the melt at the opposite side walls of a crucible having simple slots with no enlargements;

FIG. 4 is a schematic representation similar to FIG. 3 showing the meniscus formed by the melt at the opposite side walls of a crucible having capillary slots with tapered enlargements at their upper ends;

DETAILED DESCRIPTION OF THE INVENTION

Figure 1:
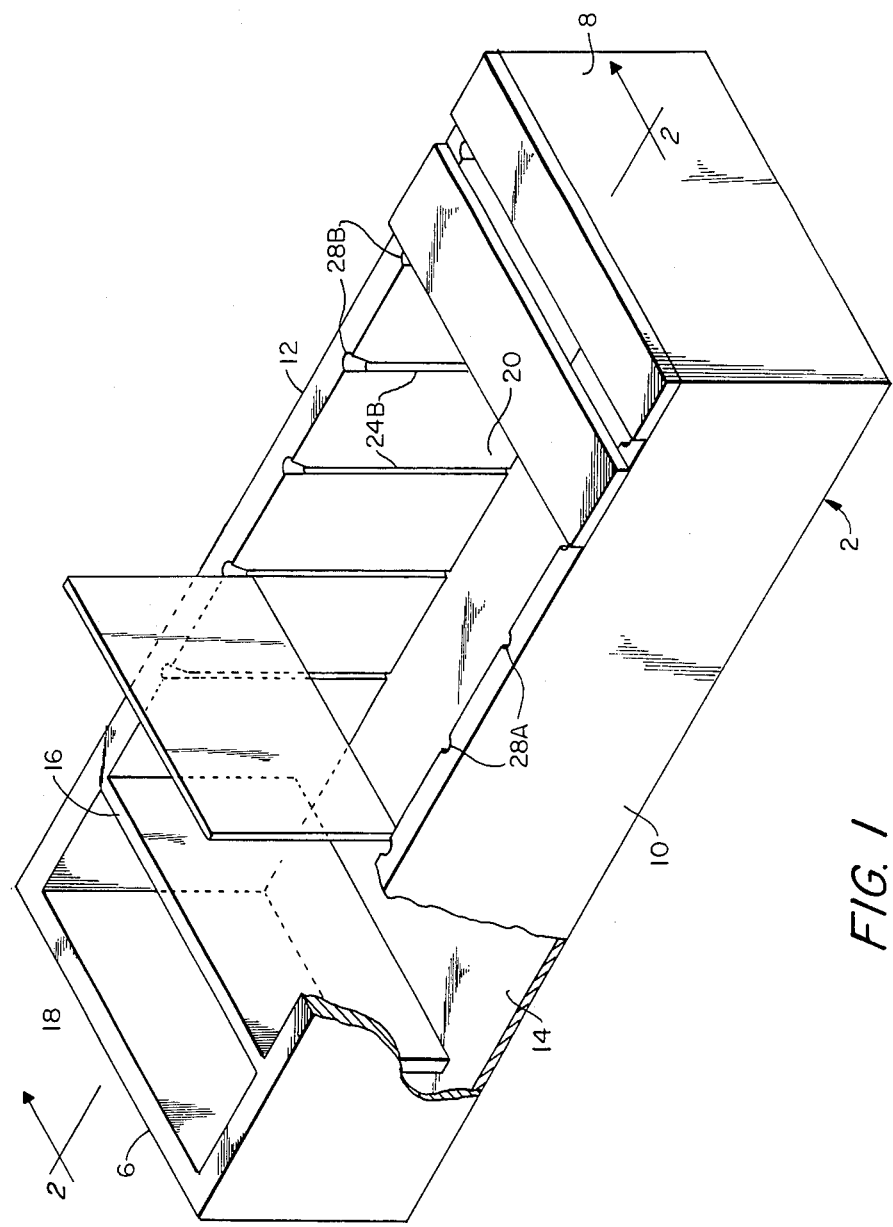
FIG. 1 is a perspective view of a preferred form of crucible designed according to the present invention.
Figure 3A:
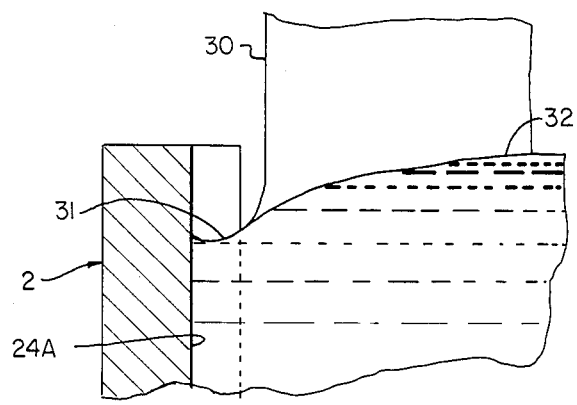
FIG. 3A is a schematic representation similar to FIG. 3 except that it shows how the meniscus at the opposite sides of the liquid/solid growth interface is inverted under a particular growth condition.

Referring now to FIGS. 1 and 2, there is illustrated a preferred form of crucible 2 for growing a plurality of silicon ribbons. Although not shown, it is to be understood that in practice the crucible is mounted in an induction-heating furnace of the type disclosed in U.S. Pat. Nos. 3,591,348, 3,687,633, 3,953,174 and 4,390,505. The crucible is made of graphite or fused quartz. In the embodiment illustrated in FIGS. 1 and 2, crucible 2 comprises a pair of end walls 6 and 8, elongated first and second opposite side walls 10 and 12, a bottom wall 14, and a partition 16 which subdivides the crucible into a feed cavity 18 for receiving solid source material, i.e., solid chunks of silicon, and a reservoir chamber 20 for containing a melt 21 of the source material. The partition 16 terminates short of bottom wall 14 of the crucible, thereby providing a passageway 22 (FIG. 2) for conducting molten source material from feed cavity 18 to reservoir chamber 20.

Referring now to FIGS. 1–4, the inner faces of side walls 10 and 12 are provided with a series of elongated grooves 24A and 24B respectively which extend from bottom wall 14 up to the upper edges 26 of the two side walls. Each of the grooves 24A in side wall 10 is aligned with a corresponding groove 24B in side wall 12, so that the two walls may be considered as coacting to provide a series of pairs of mutually aligned grooves 24A and 24B. Grooves 24A and 24B may have a rectangular or semi-circular cross-section. Preferably they have a rectangular cross-section as shown. Preferably grooves 24A and 24B are provided with tapered enlargements or counterbores 28A and 28B respectively at their upper ends. Because grooves 24A and 24B are formed in the inside faces of side walls 10 and 12, the enlarged portions 28A and 28B of the grooves essentially encompass approximately 180 degrees and preferably have a semi-circular cross-section as shown.

The grooves 24A and 24B and their enlargements 28A and 28B are of capillary size in cross-section, the grooves having a minimum cross-sectional dimension of about 0.040 inch and a maximum cross-sectional dimension of about 0.13 inch, while the enlargements 28A and 28B have a minimum cross-sectional dimension between 0.04 and 0.12 inch and a maximum cross-sectional dimension of between 0.13 and 0.38 inch. Preferably, for reasons of cost and ease of manufacture, the grooves are rectangular and have a maximum cross-sectional side to side dimension of about 0.010 inches, and the enlarged tapered portions are semi-circular in cross-section with a minimum diameter of about 0.04 inch and a maximum diameter of about 0.38 inch. Preferably the walls 10 and 12 are spaced apart between about 2 and 2.5 inches.

Figure 4A:
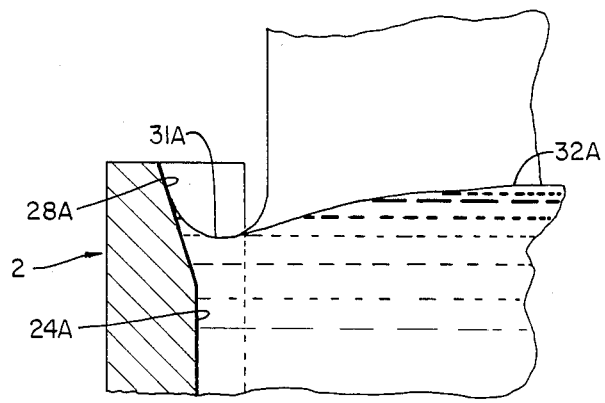
FIG. 4A is similar to FIG. 3A showing how the shape of the meniscus and the liquid/solid interface are affected by having tapered enlargements in the upper ends of the capillary slots.
Figure 5:
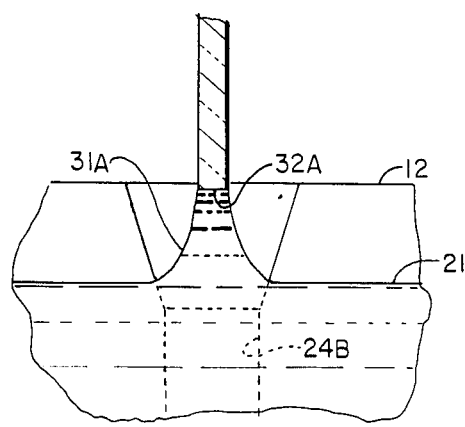
FIG. 5 is an enlarged side view schematically showing the meniscus and the liquid/solid growth interface when utilizing capillary slots with tapered enlargement at their upper ends.

Because of the capillary size of grooves 24A and 24B, surface tension causes melt to rise in the grooves above the level of the melt 21 (FIGS. 3 and 4) in reservoir chamber 20. FIG. 3 illustrates the rise of melt in grooves 24A and 24B when the grooves are of uniform size all the way to the top of side walls 10 and 12. FIG. 4 illustrates the rise of melt in the same grooves when they are formed with enlargements 28A and 28B.

The enlargements are provided to compensate for meniscus inversion at the ends or side edges of the growing ribbons during growth, whereby to stabilize the edges of the ribbons as they are being grown. It is well known that when a crystal is being pulled from a melt, a meniscus is formed at the liquid/solid interface, with the thickness and shape of the meniscus being influenced by the melt temperature at the interface, the pulling speed, the rate at which heat of solidification is rejected during crystal growth, and the contact angle between the molten silicon and (1) the growing silicon body and (2) whatever portion of the crucible (or capillary die or other shaping member) is contacted by or supports the molten silicon at the liquid/solid growth interface. In this connection, it is to be appreciated that the contact angle of molten silicon with solid silicon is different than the contact angle of molten silicon with a material such as graphite or quartz. Thus, for example, in the case of EFG growth, the thickness and shape of the meniscus is influenced by the contact angle between the capillary die and the melt film connecting the die and the growing crystalline body.

In growing silicon ribbon according to this invention, the ribbons tend to be cooler at their ends (i.e., the edges of the ribbon adjacent side walls 10 and 12) due to more efficient heat rejection in those regions, with the result that the meniscus undergoes an inversion at grooves 24A, 24B where it contacts side walls 10 and 12. More specifically, with reference to FIG. 3A where the grooves 24A and 24B are of uniform size from top to bottom, the ends of the growing ribbon 30 tend to lose heat at a faster rate than the center portion of the ribbon, with the result that the meniscus 31 is inverted at side walls 10 and 12 and the liquid/solid interface 32 is generally convex, being at a first higher level along the center portion of the growing ribbon and at a second substantially lower level at the ends of the ribbon. This meniscus inversion makes it difficult to control the liquid/solid interface, with the result that there is a tendency for a freeze-up to occur in response to changes in the rate of heat input to the melt or the pulling speed. By providing the enlargements 28A and 28B, the interface between the meniscus 31A and the side walls 10 and 12 becomes inclined, and this inclination tends to reduce the temperature inversion at the ends of the meniscus, so that the shape of the liquid/solid interface is more flat, in the manner shown at 32A in FIG. 4. As a consequence, growth is more stable and freeze-ups are reduced in frequency.

The inversion at the ends of the liquid solid interface, i.e., at the meniscus, may be further reduced by providing auxiliary heating means, located adjacent the ends of the growing ribbons. In the case where an induction heating furnace is used, the auxiliary heating means may be in the form of elongated heat susceptor plates 36 (FIGS. 3 and 4) that extend lengthwise along the opposite sides 10 and 12 of the crucible. In growing silicon ribbons, the susceptor plates 36 may be made of graphite. If an electrical resistance heating furnace is used, the suscepter plates 36 may be replaced by a plurality of elongated external electrical resistance-type heating elements, located adjacent the opposite ends of the growing ribbons.

The advantage of providing a separate feed cavity for receiving solid source material is that semiconductor grade silicon for growing ribbons for solar cells and the like generally is available in particulate form, commonly as chunks of assorted sizes. These silicon chunks are less dense than molten silicon and consequently if they were to be added directly to the silicon melt in chamber 20, they would float on top of the melt and thus tend to disrupt the liquid/solid growth interface and the temperature distribution in the melt. By adding the chunks to feed cavity 18, they are prevented from migrating into chamber 20 until they have melted, in which event melt replenishment occurs by liquid flow from feed cavity 18 via passageway 22 into the bottom of chamber 20. Inflow of molten source material into the bottom of chamber 20 creates little or no perturbations of the temperature distribution in the melt or of the liquid/solid growth interface(s) at the upper end of chamber 20.

Replenishment of source material in feed cavity 18 may be accomplished by various means known to persons skilled in the art. No means for replenishing the melt is illustrated since such means form no part of the present invention.

In the preferred form of the invention, two or more ribbons are grown simultaneously. In such event a single pulling mechanism is used to (a) hold two or more selected seeds, (b) contact those seeds with the melt, and (c) thereafter pull the seeds and the growing ribbons vertically away from the melt. The seeds are preferably silicon ribbons having a thickness on the order of, but preferably somewhat greater than, the desired thickness of the ribbons to be grown, and a width close to but somewhat less than the distance between side walls 10 and 12. Preferably, the several ribbon-like seeds may be releasably mounted to a horizontal seed holder or support plate in parallel spaced relation to one another. The concept of mounting several seeds to a common seed holder plate is well known to persons skilled in the art, as exemplified by U.S. Pat. No. 4,440,728, issued to Richard W. Stormont and Lawrence Eriss for "Apparatus for Growing Tubular Crystalline Bodies". Thus, for example, with reference to FIG. 2, a pulling mechanism shown in part at 40 may be used that comprises a seed support plate 42 having pairs of mounting plates 44 and 46 to which seed ribbons 48 are attached by suitable means. If the seed ribbons are made of silicon, seed support plate 42 and mounting plates 44 and 46 are preferably made of graphite. The spacing between seed ribbons 48 is made large enough to be conducive to radiative heat conduction between the ribbons.

The seed ribbons 48 may be ribbons grown according to the present invention or seeds grown by other methods, e.g., ribbons grown by EFG.

EXAMPLE

Following is a specific example of how to practice the present invention where silicon ribbons are to be grown.

An induction heated crystal growing furnace similar to that shown in U.S. Pat. Nos. 3,591,348, 3,687,633, 3,953,174 and 4,390,505 is provided. A rectangularly shaped crucible similar to that shown in FIGS. 1–4 is also provided. The crucible is made of graphite and has two parallel opposite side walls 10 and 12 each provided with four identical grooves 24A and 24B. Each groove 24A and 24B has a square cross-section with the side-to-side dimension being about 0.06 inch. Grooves 24A and 24B have tapered enlargements 28A and 28B at their upper ends, with the latter having a semi-circular cross-section with a diameter that varies between 0.06 and 0.25 inch. The height of the inner faces of side walls 10 and 12 is about 1.38 inches measured from the upper surface of bottom wall 14. The distance between the inner faces of side walls 10 and 12 is about 2.13 inches.

The crucible has a partition 16 that subdivides it into a first source-receiving cavity 18 and a second melt-containing chamber 20. The crucible is mounted on a pedestal in the furnace and means (not shown) are provided for adding (on command) silicon in solid form, e.g., chunks, to source-receiving chamber 18. A pair of graphite susceptor plates are mounted as shown at 36 in FIGS. 3 and 4. These susceptor plates extend for the full distance between end walls 6 and 8 so as to facilitate melting of the source material in cavity 18 as well as stabilizing the temperature of the liquid/growth interfaces at side walls 10 and 12.

The pulling mechanism has a horizontal support plate 42 fitted with four pairs of mounting plates 44 and 46, and four seed ribbons are mounted in place between plates 44 and 46. Then with the melt in the upper portion of reservoir chamber 20 at a temperature of about 1450 degrees C., columns of melt tend to rise in the capillary grooves 24A and 24B above the level of the top of the melt in reservoir chamber 20. Then the four seeds are lowered by the pulling mechanism between side walls 10 and 12 in alignment with grooves 24A,B. The four seed ribbons are brought into contact with the melt and held there for a few seconds to assure that their bottom ends are fully wetted by the melt. Then the pulling mechanism is operated so as to cause the seeds to be withdrawn upwardly from the crucible at a rate of about 0.25 to 0.5 inch per minute. As the seeds are withdrawn, a meniscus is formed between each ribbon and the melt, with the meniscus extending from the base of a groove 24A in side wall 10 to the base of the corresponding groove 24B in the other side wall 12, and crystal growth occurs at the bottom end of each seed ribbon as the latter moves upwardly. As a consequence of the enlargements 28A and 28B, each meniscus assumes and maintains the general form illustrated in FIG. 4. During crystal growth, additional source material is added to feed cavity 18 at a predetermined rate calculated to maintain the melt in the crucible chamber 20 at a selected level about 0.25 inch below the upper ends of grooves 24A and 24B.

On termination of growth, the broad opposite sides of each ribbon will be found to be relatively flat, with a flatness comparable to ribbons grown by the EFG process.

Ribbons made according to the invention are suitable for making silicon solar cells. Thus a further aspect of this invention is to process a ribbon grown in the manner described above so as to form a P/N junction adjacent a first one of its two broad surfaces, and thereafter form a grid electrode on that first broad surface and a back electrode on the second broad surface, whereby when the first surface is exposed to solar radiation, an electrical potential will be established between the two electrodes. Formation of the electrodes may be accomplished according to well established techniques, e.g., by the plating process described in U.S. Pat. No. 4,321,283 issued Mar. 23, 1982 to Kirit B. Patel and Ronald Gonsiorawski for "Nickel Plating Method."

The invention has several significant advantages. First of all, the capillary action in grooves 24A and B and the enlargements 28A and 28B coact to provide edge stabilization, with the result that if the pulling speed and heating rates are kept constant, the ribbons will have a virtually constant width determined by the spacing of walls 10 and 12 and the contact angle of the silicon with the enlargements 28A and 28B. A second advantage is that a crucible such as shown in FIGS. 1–4 is relatively easy to manufacture to acceptable tolerances. Thirdly, unlike the process described by Thornhill, it is a relatively easy matter to initiate and sustain ribbon growth. Fourthly, the grown ribbons tend to have less total impurities than ribbons grown by the EFG technique, since the present process facilitates rejection of impurities at the liquid/solid interface in much the same way as occurs in Czochralski growth. A fifth advantage is that it provides an easy way to carry out growth of two or more ribbons simultaneously from a single crucible.

Still other advantages will be obvious to persons skilled in the art.

What is claimed is:

1. A method of growing a silicon ribbon from a silicon melt comprising the steps of:
   (a) providing a crucible made of graphite or quartz and having first and second opposed side walls, at least one pair of first and second mutually confronting grooves formed in the inner faces of said first and second opposed side walls, said grooves being of capillary dimensions and extending to the top of the crucible;
   (b) providing a supply of molten silicon in said crucible so that molten silicon will rise in said grooves by action of capillary rise, introducing a seed into said supply of molten silicon between each first and second mutually confronting grooves, withdrawing each seed so as to establish a sheet of molten, silicon between said grooves that is a continuum with the melt in said grooves, and growing at least one silicon ribbon from said melt by pulling each seed upwardly away from said crucible so that the sheet of melt attached to each seed will crystallize and form a continuous solid extension of each seed in the form of a ribbon.

2. A method according to claim 1 wherein each of said grooves is enlarged at its upper end.

3. A method according to claim 1 wherein said crucible is associated with a supply compartment adjacent to the crucible, and further including the step of transmitting molten source material from said supply compartment to said crucible.

4. A method according to claim 1 wherein the opposite side walls of the crucible have a plurality of capillary-size grooves formed on their inner faces.

5. A method according to claim 1 further including the step of supplying heat to the melt in said crucible by heating means located outside of said crucible adjacent said grooves, so as to facilitate control of the temperature of the melt at said grooves.

6. A method according to claim 1 further comprising the steps of:
   (a) forming a P/N junction in at least a portion of each silicon ribbon adjacent one surface thereof; and
   (b) forming electrodes on the first and second opposite surfaces of each ribbon with the electrode on said one surface being adapted to allow the junction to respond to radiant energy directed at said one surface.

7. A method of growing a silicon ribbon from a silicon melt comprising the steps of:
   (a) providing a crucible made of graphite or quartz and having first and second parallel and mutually confronting side walls with first and second mutually confronting grooves formed in the inner faces of said first and second side walls respectively, said grooves being of capillary dimensions and extending to the top of the crucible;
   (b) providing a supply of molten silicon in said crucible in contact with said first and second side walls so that molten silicon will rise in said grooves by action of capillary rise;
   (c) introducing a seed into said supply of molten silicon between said first and second grooves;
   (d) withdrawing said seed so as to establish a sheet of molten silicon between said grooves as a continuum with the melt in said grooves; and
   (e) growing a silicon ribbon from said melt by pulling said seed upwardly away from said crucible so that the sheet of molten silicon attached to said seed will crystallize and form a continuous extension of said seed in the form of a ribbon-like body.

8. A method according to claim 7 wherein each of said grooves is enlarged at its upper end, and said seed is contacted with said melt at said upper ends of said grooves.

9. A method according to claim 7 wherein the crucible has a plurality of pairs of capillary-size first and second mutually confronting grooves formed in the inner face of said first and second side walls respectively, whereby a growth pool of melt is established between each pair of first and second grooves, and further including the steps of (a) introducing individual seed crystals to each of said growth pools of melt, so as to establish a sheet of molten silicon between each pair of first and second grooves, and (b) withdrawing said seeds upwardly away from said growth pools of melt so that said sheets of melt will crystallize and form continuous extensions of said seeds in the form of ribbons.

10. A method according to claim 9 further including the step of supplying heat to said melt by heating means located outside of said crucible adjacent said grooves, so as to facilitate control of the temperature of the melt at said grooves.

* * * * *

UNITED STATES PATENT AND TRADEMARK OFFICE
CERTIFICATE OF CORRECTION

PATENT NO. : 4,721,688

DATED : January 26, 1988

INVENTOR(S) : Richard W. Stormont et al

It is certified that error appears in the above-identified patent and that said Letters Patent is hereby corrected as shown below:

Claim 1, column 6, line 54, the comma should be deleted after the word "molten"; and Signed and Sealed this Second Day of August, 1988

Attest:

Attesting Officer

DONALD J. QUIGG

Commissioner of Patents and Trademarks

UNITED STATES PATENT AND TRADEMARK OFFICE
CERTIFICATE OF CORRECTION

PATENT NO. : 4,721,688
DATED : January 26, 1977
INVENTOR(S) : Richard W. Stormont et al.

It is certified that error appears in the above-identified patent and that said Letters Patent is hereby corrected as shown below:

Claim 1, column 6, line 54, the comma should be deleted after the word "molten"; and Claim 6, column 7, line 15, delete the word "the".

This certificate supersedes Certificate of Correction issued August 2, 1988.

Signed and Sealed this

Eleventh Day of October, 1988

Attest:

DONALD J. QUIGG

*Attesting Officer*    *Commissioner of Patents and Trademarks*